United States Patent
Furuyama

(10) Patent No.: US 6,365,911 B1
(45) Date of Patent: Apr. 2, 2002

(54) BIDIRECTIONAL SEMICONDUCTOR LIGHT-EMITTING ELEMENT AND OPTICAL SYSTEM

(75) Inventor: Hideto Furuyama, Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/621,482

(22) Filed: Jul. 21, 2000

(30) Foreign Application Priority Data

Jul. 23, 1999 (JP) ............................................. 11-209062

(51) Int. Cl.$^7$ ............................................... H01L 33/00
(52) U.S. Cl. ............................. 257/25; 257/13; 257/14; 257/90; 257/96; 257/97; 257/104; 257/106
(58) Field of Search ............................... 257/12, 13, 14, 257/25, 88, 89, 90, 94, 96, 97, 104, 106

(56) References Cited

U.S. PATENT DOCUMENTS

| | | | | |
|---|---|---|---|---|
| 3,864,721 A | * | 2/1975 | Cohen | 357/17 |
| 4,577,207 A | * | 3/1986 | Copeland | 357/17 |
| 5,079,601 A | * | 1/1992 | Esaki et al. | 357/4 |
| 5,212,706 A | * | 5/1993 | Jain | 372/50 |
| 5,679,963 A | * | 10/1997 | Klem et al. | 257/46 |
| 5,995,529 A | * | 11/1999 | Kurtz et al. | 372/45 |
| 6,278,134 B1 | * | 8/2001 | Capasso et al. | 257/96 |

FOREIGN PATENT DOCUMENTS

| | | | | |
|---|---|---|---|---|
| JP | 3-058532 | | 3/1991 | |
| JP | 7-202321 | * | 8/1995 | H01S/3/18 |

OTHER PUBLICATIONS

L. Esaki, Phys. Rev. vol. 109, pp. 603–604, "New Phenomenon in Narrow Germanium p–n Junctions," 1958.

D.L. Miller, et al., J. Appl. Phys., vol. 53, No. 1, pp. 744–748, "GaAs–AlGaAs Tunnel Junctions for Multigap Cascade Solar Cells," Jan. 1982.

A.R. Sugg, et al., Appl. Phys. Lett., vol. 62, No. 20, pp. 2510–2512, "n–p–($p^+$–$n^+$)–n $Al_yGa_{1-y}As$–GaAs–$In_xGa_{1-x}As$ Quantum–well laser with $p^+$–$n^+$ GaAs–InGaAs Tunnel Contact on n–GaAs," May 17, 1993.

* cited by examiner

Primary Examiner—Eddie Lee
Assistant Examiner—Bradley WM. Baumeister
(74) Attorney, Agent, or Firm—Oblon, Spivak, McClelland, Maier & Neustadt, P.C.

(57) ABSTRACT

According to the invention, a bidirectional semiconductor light emitting element is provided, which comprises: a first semiconductor region of a first type of conductivity; a second semiconductor region of a second type of conductivity provided on the first semiconductor region; a third semiconductor region of a first conductivity type provided on the second semiconductor region; and a semiconductor light emitting layer interposed in the second semiconductor region, the light emitting layer emitting light by an injection of a tunneling current generated at a reverse-biased p-n junction between the first and second regions or between the second and third regions under an application of a voltage of a first polarity across the first and third semiconductor regions, and the light emitting layer emitting light by an injection of a tunneling current generated at another reverse-biased p-n junction between the first and second regions or between the second and third regions under an application of a voltage of a second polarity, which is opposite to the first polarity, across the first and third semiconductor regions.

20 Claims, 13 Drawing Sheets

BIDIRECTIONAL SEMICONDUCTOR LIGHT-EMITTING ELEMENT AND OPTICAL SYSTEM

BACKGROUND OF THE INVENTION

The present invention relates to a bidirectional semiconductor light-emitting element capable of emitting lights irrespective of the application of a positive or negative bias voltage.

A semiconductor light-emitting element such as a light-emitting diode or a semiconductor laser has characteristics including a compact form, a high efficiency, a long life and so on, and hence it has been used for various purposes as a light source in place of a conventional electric lamp or various tube lasers. However, since such a semiconductor light-emitting element basically uses a carrier injection type diode based on a p-n junction or a metal-semiconductor junction, a forward or a reverse polarity is present when a bias voltage is applied to the device. In addition, for this reason, the device generally exhibits an operational characteristic such as a half wave current-rectifying when an AC voltage is applied.

Owing to such diode characteristics, it is required to install a plurality of light-emitting elements or an external rectifier circuit if the conventional semiconductor light-emitting element is powered by AC.

However, the installation of the rectifier circuit inevitably generates an electric switching loss. Consequently, the use of the conventional semiconductor light-emitting element for an AC light source based on commercial power (AC) leads to a reduction in overall power conversion efficiency due to the loss of an external circuit even if the light conversion efficiency of the device is high.

Furthermore, as the energized polarity of the device is one-directional, if the device is used for information signal transmission (optical transmission), it is necessary to convert an AC electric signal or the like into an electric signal vibrated up and down at a virtual mid-point of a bias, and then enter the converted signal. Thus, there is a problem of forcible consumption of power corresponding to a bias current even at the non-entry time of a signal.

As one of the measures to solve these problems, there is available a method, which uses a plurality of semiconductor light-emitting elements as described above. In other words, if a plurality of semiconductor light-emitting elements arranged in parallel while having the polarities reversed each other, the problems may be solved. However, this method necessitated more than one semiconductor light-emitting elements to be provided, therefore, the whole structure becomes more complicated and the cost becomes higher. Besides, there is a problem of a reduction in the operating efficiency of the individual devices. Further, in order to apply to optical transmission, it is necessary to introduce the lights from two separate devices into one optical transmission path, or use two separate optical transmission paths or other complicated means.

FIG. 18 shows an example of an optical transmission system using two separate semiconductor light-emitting elements. This example is described in Japanese Patent Application Laid-Open No. H3-58532(1991), and designed to reduce the consumption of power by transmitting only pulse edge information for the optical transmission of a digital signal. In FIG. 18, a reference numeral 23 denotes a pulse signal source; 24 a coupling capacitor; 29 and 30 semiconductor light-emitting elements; 26a and 26b optical transmission paths; 31 and 32 photodiodes (light receiving devices); and 33 a photodiode parasitic capacity (AC equalizing circuit device). The internal resistors of the capacitor 24 and the pulse signal source 23 constitute an electric differentiating circuit.

The optical transmission system described herein by reference can greatly reduce the consumption of power by transmitting the differential wave of a pulse signal compared with a signal transmission over the full width of the pulse signal. However, as the electrical differential waves (current waves flowing across the capacitor 24) of the signal pulse alternately appear as positive and negative polarity peak waves, conversion into optical signals by using the conventional single semiconductor light-emitting element cannot be made. Therefore, in the example shown in FIG. 18, the two separate semiconductor light-emitting elements 29 and 30 are connected in parallel with reversed polarities, and the positive and negative polarity peak waves of the electrical differential wave are converted into optical signals by using the different semiconductor light-emitting elements. Moreover, the optical signals are transmitted separately, and subjected to electric conversion by the two photodiodes 31 and 32. Then, the converted optical signals are integrated by the capacitor 33 to restore the original pulse signal.

As explained above, in the case of using the conventional semiconductor light-emitting element, it is necessary to use a plurality of devices for optical conversion of an AC electric signal or to perform rectification, bias superimposition and so on, by using an external circuit.

SUMMARY OF THE INVENTION

It is an object of the present invention to provide a bidirectional semiconductor light-emitting element capable of performing optical conversion for an AC electric signal by one device.

In order to achieve the foregoing object, according to the invention, there is provided a bidirectional semiconductor light emitting element comprising:

a first semiconductor region of a first type of conductivity;

a second semiconductor region of a second type of conductivity provided on said first semiconductor region;

a third semiconductor region of a first conductivity type provided on said second semiconductor region; and a semiconductor light emitting layer interposed in said second semiconductor region, said light emitting layer emitting light by an injection of a tunneling current generated at a reverse-biased p-n junction between said first and second regions under an application of a voltage of a first polarity across said first and third semiconductor regions, and said light emitting layer emitting light by an injection of a tunneling current generated at another reverse-biased p-n junction between said second and third regions under an application of a voltage of a second polarity, which is opposite to said first polarity, across said first and third semiconductor regions.

According to the invention there is also provided a A bidirectional semiconductor light-emitting element comprising:

a first electrode;

a first p-n junction;

a first semiconductor light emitting layer;

a second semiconductor light emitting layer;

a second p-n junction; and a second electrode, said light emitting layer emitting light by an injection of a tunneling current generated at said first p-n junction which is reverse-biased under an application of a voltage of a first polarity across said first and second electrodes, and said light emitting layer emitting light by an injection of a tunneling current generated at said second p-n junction which is reverse-biased under an application of a voltage of a second polarity, which is opposite to said first polarity, across said first and second electrodes.

According to one preferred embodiment of the invention, there may be provided a bidirectional semiconductor light-emitting element as a diode device, comprising: at least one semiconductor light emitting layer included in an n-p-n junction (or a p-n-p junction); and an electrode in each n-type semiconductor of the n-p-n junction (or in each p-type semiconductor of the p-n-p junction). In this case, an impurity concentration is set so that a tunneling current is generated between bands when each p-n junction of the n-p-n junction (or the p-n-p junction) is a reverse bias, and electricity is conducted to emit a light in any of positive and negative polarities of voltages applied to the diode device.

According to another preferred embodiment of the invention, there may be provided a bidirectional semiconductor light-emitting device which is a diode device, comprising: at least one semiconductor light emission layer included in an n-p-n-p-n junction (or a p-n-p-n-p junction); and an electrode provided in each n type semiconductor outside the n-p-n-p-n junction (or in each p type semiconductor outside the p-n-pn-p junction), wherein an impurity concentration is set so that when a bias voltage is applied to the diode device, a tunnel current may be generated between bands in one of two p-n reverse bias junctions of the n-p-n-p-n junction (or the p-n-p-n-p junction) and the other p-n reverse bias junction may be punched through, and electricity is conducted to emit lights in either case of positive and negative polarities of voltages applied to the diode device.

The p-n junction for generating the tunnel current, an energy difference between an n side conductive band and a p-type valance band in a thermal equilibrium state may preferably be 100 meV or higher.

The semiconductor light emission layers may preferably be constituted of two layers, and the wavelengths of lights emitted from the semiconductor light emission layers are different from each other.

The wavelengths of the emitted lights may depend on the polarities of voltages applied to the diode device.

According to another preferred embodiment of the invention, there may be provided an optical transmission apparatus wherein a differential wave of an electric input signal is applied to a bidirectional semiconductor light-emitting device which is capable of conducting electricity to emit light bidirectionally and which has the wavelengths of emitted lights depending on energized polarities, and an output light of the bidirectional semiconductor light-emitting device is transmitted to thereby perform signal transmission.

According to the semiconductor light-emitting element of the invention, lights can be emitted by a single device with respect to applied voltages of both positive and negative polarities, and a direct connection can be made to an AC power source to set it as an AC light emission source without using a plurality of devices or any external rectifier circuits. Accordingly, it is possible to provide an AC light emission source without any increases of the number of devices or any external loses. Moreover, it is possible to provide a novel application system such as an optical transmission system (described later) for performing optical conversion of an AC electric signal.

As described above, according to the invention, the bidirectional semiconductor light-emitting element can be provided, which is capable of conducting electricity to emit lights in any of positive and negative polarities, and constituting the AC light emission source without using a plurality of devices or any external circuits. In addition, the invention is advantageous in that an AC electric signal can be converted into a light basically without rectification, bias application or other operations, and a novel optical applications system impossible by the conventional device can be provided

BRIEF DESCRIPTION OF THE DRAWINGS

The present invention will be understood more from the detailed description given herebelow and from the accompanying drawings of preferred embodiments of the invention. However, the drawings are not intended to imply any limitation of the invention to a specific embodiment, but are for explanation and understanding only.

In these drawings.

DETAILED DESCRIPTION OF THE PREFERRED EMBODIMENTS

The present invention will be described below in detail with reference to the accompanying drawings.

Figure 1:
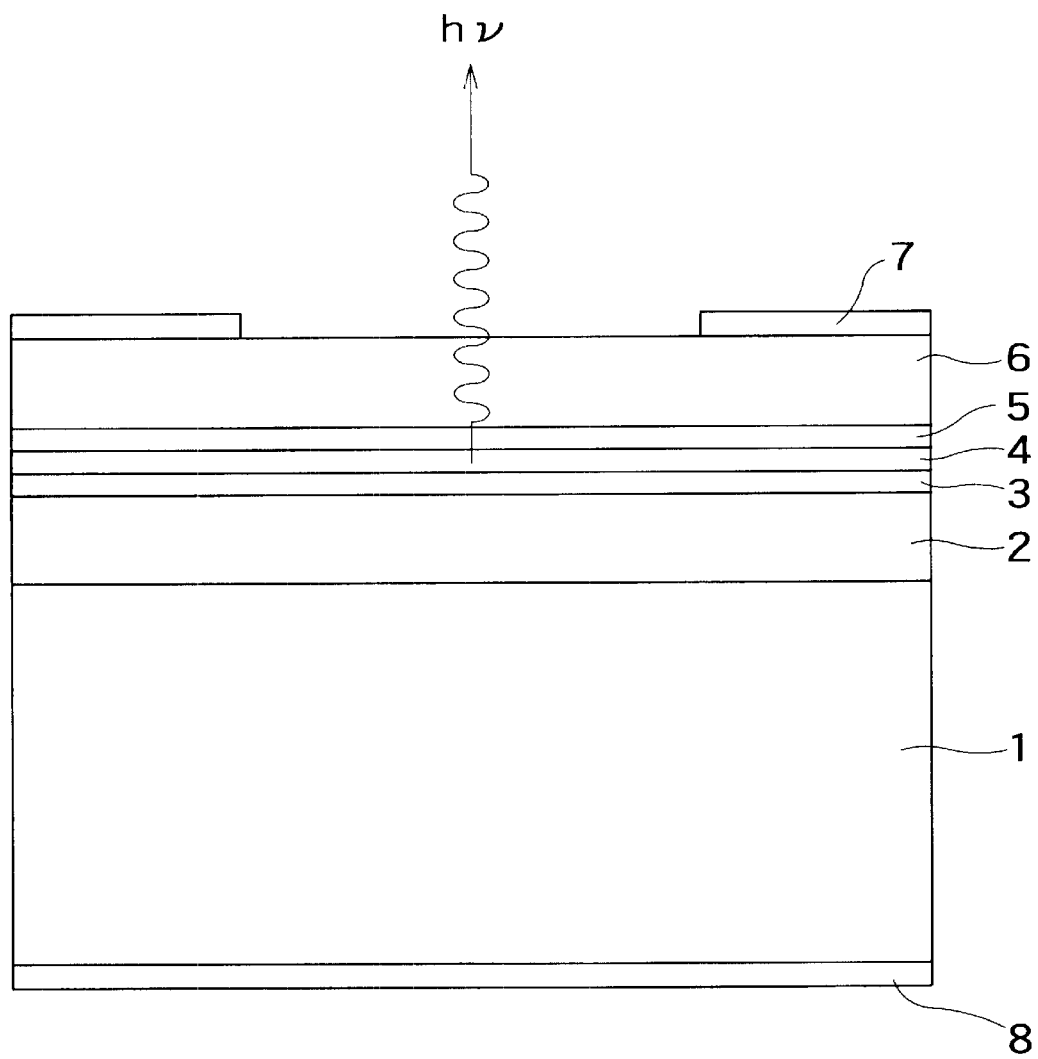
FIG. 1 schematically shows in section the structure of a bidirectional semiconductor light-emitting element according to an embodiment of the invention, by taking an example of the device of an n-p-n junction type.

FIG. 1 schematically shows in section the structure of a bidirectional semiconductor light-emitting element according to an embodiment of the invention, by taking an example of the device of an n-p-n junction type. In the drawing, a reference numeral 1 denotes an n-type semiconductor substrate; 2 a high concentration n-type semiconductor layer; 3 a high concentration p-type semiconductor layer; 4 a light emitting layer (active layer); 5 a high concentration p-type semiconductor layer: 6 a high concentration n-type semiconductor layer; and 7 and 8 electrode metals. The p-n junction of the reference numerals 2 and 3 and the p-n junction of the reference numerals 5 and 6 exhibit usual p-n junction characteristics under a forward bias. However, these p-n junctions are set to generate a tunneling current between bands When a reverse bias of a predetermined magnitude or higher is applied.

As the constitutional examples of the respective semiconductor layers, the reference numeral 1 is an n-type InP substrate (carrier concentration $1 \times 10E18/cm^3$, a thickness of 100 $\mu$m); 2 an n-type InP (carrier concentration $1 \times 10E19/cm^3$, a thickness of 1 $\mu$m); 3 a p-type InP (carrier concentration $2 \times 10E18/cm^3$, a thickness of 0.2 $\mu$m); 4 GaInAsP (undoped, emitted light wavelength of 1.3 $\mu$m, a thickness of 0.1 $\mu$m); 5 a p-type InP (carrier concentration $2 \times 10E18/cm^3$, a thickness of 0.2 $\mu$m); 6 an n-type InP (carrier concentration $1 \times 10E19/cm^3$, a thickness of 1.5 $\mu$m); and 7 and 8, e.g., AuGe (thickness 0.3 $\mu$m) as ohmic electrodes with respect to type InP. The operation of this device will be described by referring to the energy band views of FIGS. 2A to 2C.

Figure 2A:
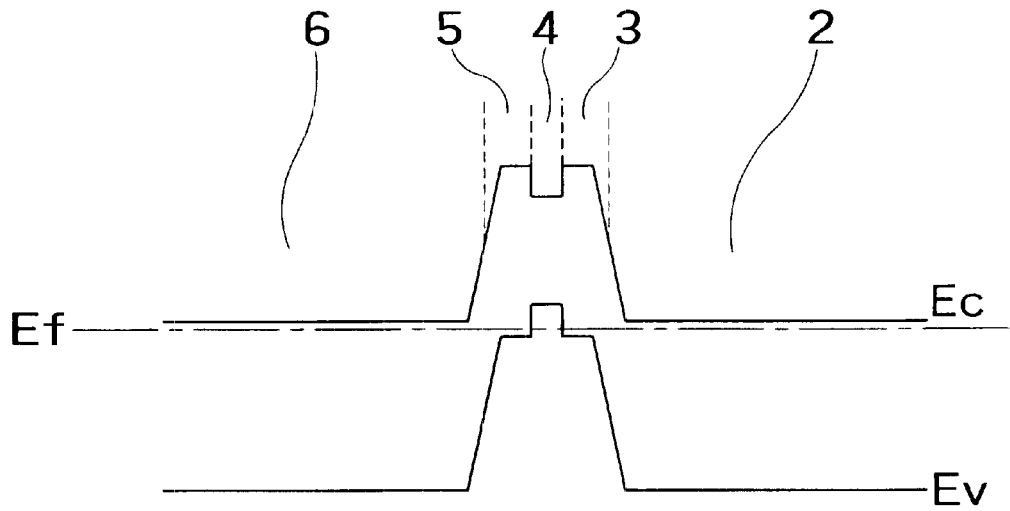
FIG. 2A shows an energy band in a thermal equilibrium state (no bias)

FIG. 2A shows an energy band in a thermal equilibrium state (no bias). In the drawing, a reference code Ec denotes a conduction band; Ev a valence band; and Ef Fermi level. It can be understood that the conduction band Ec of the high concentration n-type portions 2 and 6 is close to the valence band Ev of the high concentration P type portions 3 and 5. The major part of the light-emitting element according to the invention has basically the symmetric band structure along the stacking direction at the thermal equilibrium state.

Figure 2B:
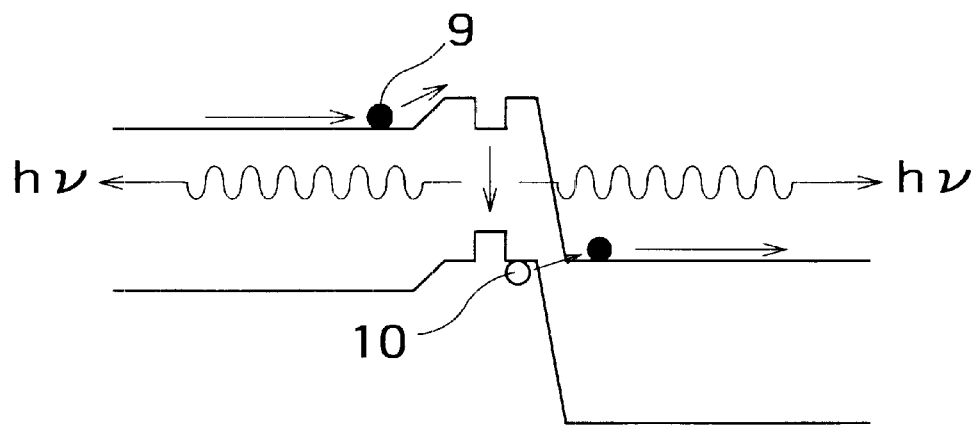
FIG. 2B shows a state resulted from applying a voltage to the state of FIG. 2A with the electrodes 8 and 7 respectively set as positive and negative.
Figure 2C:
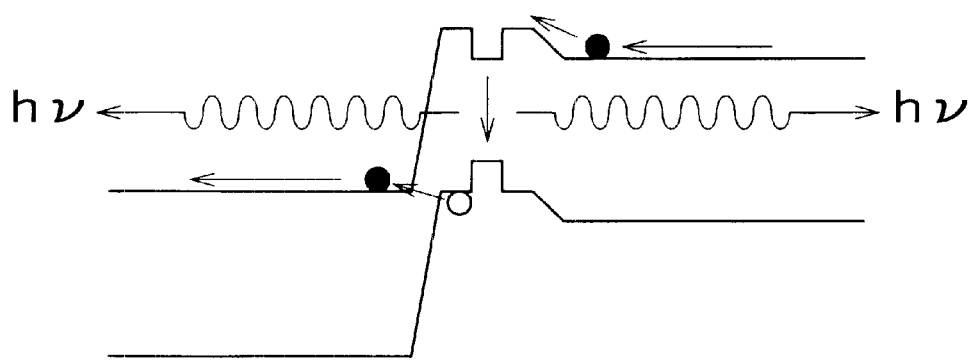
FIG. 2C shows a state when the biases are reversed.

FIG. 2B shows a state resulted from applying a voltage to the state of FIG. 2A with the electrodes 8 and 7 respectively set as positive and negative. In this case, the p-n junction of the n-type InP 6 and the p-type InP 5 is under forward bias, while the p-n junction of the p-type InP 3 and the n-type InP 2 is under a reverse bias. In the figure, a reference numeral 9 denotes an electron; and 10 a hole. In the case of a p-n junction at a normal carrier concentration (e.g., $1 \times 10E18/cm^3$ for both p and n-types), most of the voltage is applied to the p-n junction of the reverse bias side, and the expansion of a depletion layer by the reverse bias suppresses carrier injection to supply only a current equal to a so-called leaking current. In this example, however, since the p-n junction is a high-concentration junction, a current flows through the device even at the reverse biased condition because of a tunneling current between the bands.

The tunneling current between the bands has a characteristic that a hole and an electron are respectively generated in the valence band and the conduction band equivalently by a carrier movement from the valence band to the conduction band (movement of an electron from the valence band to the conduction band). In other words, in the semiconductor layers 3, 4 and 5, holes generated by the tunneling current between the bands are gradually increased.

In general, the behavior of the p-n junction having a tunneling current generated between bands is similar to that of the resistor of low resistance, and the applied voltage of the p-n junction is not changed much even if the current injection is increased. Thus, in the state of FIG. 2B, the increased amount of a device voltage after the generation of the tunneling current between the bands at the p-n reverse bias junction of the n-type InP 2 and the p-type InP 3 is applied to the p-n forward bias junction of the p-type InP 5 and the n-type InP 2 rather than to the p-n reverse bias junction of the n-type InP 2 and the p-type InP 3. As a result, a current voltage characteristic provided accords with the general forward bias characteristic of the p-n junction.

In FIG. 2B, with the increase in the applied voltage of the device, the bias voltage of the forward bias voltage between the p-type InP 5 and the n-type InP 6 is increased. However, when this bias voltage is increased close to the diffusion potential of the p-n junction, so-called carrier injection occurs, where electrons and holes are injected respectively from the n-side (6) and the p-side (5) to the p-n junction. As a result, the electrons injected from the n-type InP 6 are diffused in the p-type InP 5 to reach the light emitting layer 4, and then recombine with the holes (carriers of the tunneling current between the bands) accumulated in the light emitting layer 4 to emit lights.

The foregoing mechanism causes the device of the embodiment to operate as a semiconductor light-emitting element. However, as described above, since the p-n junction of the n-type InP 2 and the p-type InP 3 and the p-n junction of the p-type InP 5 and the n-type InP 6 are set at similar carrier concentrations using similar materials, similar operations can be performed even if device biases are applied in reverse directions (electrode 8 is negative, and electrode 7 is positive). If device biases are reverse, then an operational state becomes one like that shown in FIG. 2C, and thus the device is also operated as a semiconductor light-emitting element. Therefore, in the embodiment of the invention, even at the application of device bias of any of positive and negative polarities, the device can function as a bidirectional semiconductor light-emitting element capable of emitting lights.

Herein, in the state shown in FIG. 2A, Ec and Ev are separated from each other by a given energy gap holding Ef therebetween.

On the other hand, in the case where the Ec of the n-type InP 2 and 6 and the Ev of the p-type InP 3 and 5 are overlapped even in the equilibrium state (e.g., in the embodiment of FIG. 1, the case where the carrier concentration of the p-n junction is $1\times10E19/cm^3$ or higher both in the p and n-type regions), a tunneling current between bands is generated even if the p-n junction is a forward bias, and tunneling currents are simultaneously generated at the p-n junction of the n-type Inp 2 and the p-type InP 3 and the p-n junction of the p-type InP 5 and the n-type InP 6. As a result, the injection of minority carriers at the forward bias p-n junction is not executed up to a considerably high current region. In other words, a current having no contribution to light emission is generated. For example, in the above example, a current of 1 $kA/cm^2$ may inevitably become a reactive current.

Such a phenomenon can be suppressed by setting one p-n junction in the state of generating a tunneling current between bands, and the other p-n junction in the condition of generating little tunneling current between bands. However, under such a condition, the device becomes basically similar to the conventional semiconductor light-emitting element of one-side energization, and cannot operate as a bidirectional semiconductor light-emitting element.

Thus, in the bidirectional semiconductor light-emitting element of the invention, to realize the effective operation of the device, a condition should be set in such a manner that a tunneling current can be generated between bands at both of the two p-n junctions holding the light emitting layer therebetween by reverse biases and, in the thermal equilibrium state, no tunneling currents can be generated between bands in any of the p-n junctions.

Therefore, an energy difference between the Ec and the Ev of FIG. 2A should preferably be set slightly larger than the heat energy of a room temperature (about 26 meV). For example, if an energy difference is 100 meV, a current not contributing to light emission can be practically suppressed. In addition, in this case, an excessive bias (voltage generating a tunneling current between the bands at one p-n junction) necessary for a device operation is also around 0.1 V, preventing the problem of the extreme increase of a device operation bias.

Figure 3:
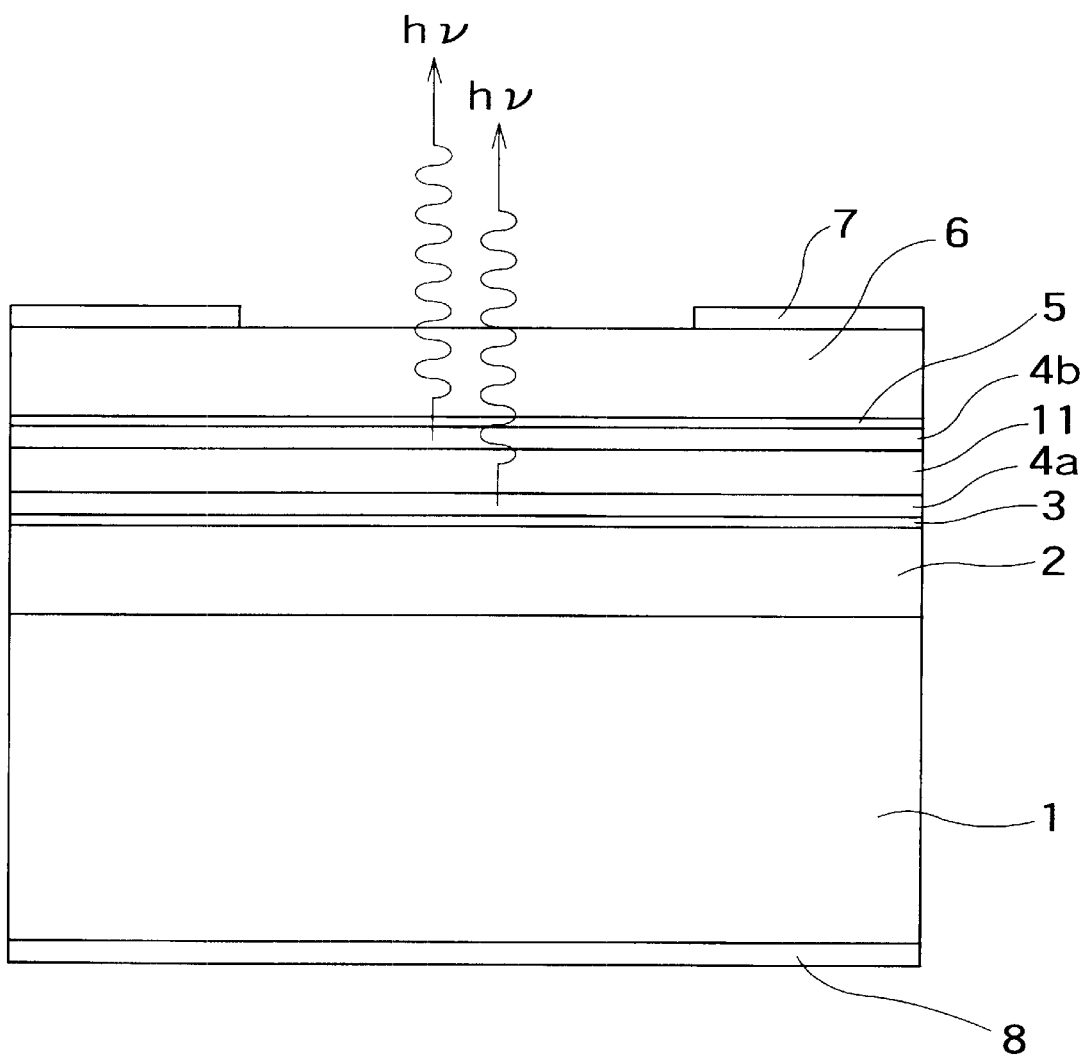
FIG. 3 shows another embodiment of the invention, taking an example of the improvement of the light emitting efficiency of the embodiment shown in FIG. 1.

FIG. 3 shows another embodiment of the invention, taking an example of the improvement of the light emitting efficiency of the embodiment shown in FIG. 1. In the drawing, reference numerals 4a and 4b denote light emitting layers (e.g., undoped GaInAsP active layer of wavelength 1.3 μm, each having a thickness of 0.1 μm); and 11 a p-type middle layer (e.g., p-type InP having a carrier concentration of $1\times10E18/cm^3$, and a thickness of 1 μm). In this embodiment, high concentration p-type semiconductor layers (e.g., p-type InP having a carrier concentration of $2\times10E18/cm^3$) 3 and 5 are formed to be thinner than those of the first embodiment, each having a thickness of 0.05 μm.

In the example of FIG. 1, if the high concentration p-type semiconductor layers 3 and 5 are formed to be too thin, the electrons injected into the p-type region including the light emitting layers are diffused to partly reach the reverse bias p-n junction, resulting in a non-radiative current component. Thus, in the example of FIG. 1, the total layer thickness of the three semiconductor layers 3, 4 and 5 should preferably be set sufficiently greater than an electron diffusion length (approximately 1 μm).

On the other hand, however, if a distance from the p-n junction to the light emitting layers is too long, electrons as minority carriers are inter-band recombined again with the holes of the valence band to be reduced, losing the electrons reaching the light emitting layers and thus reducing light emitting efficiency.

Thus, in the embodiment shown in FIG. 1, there is a trade-off relationship between the thick formation of the p-type region and the thin thickness from the p-n junction to the light emitting layers. To realize a bidirectional light-emitting element, there is a need for improvement in that a reactive current is inevitably included partly in optimal designing.

Figure 4A:
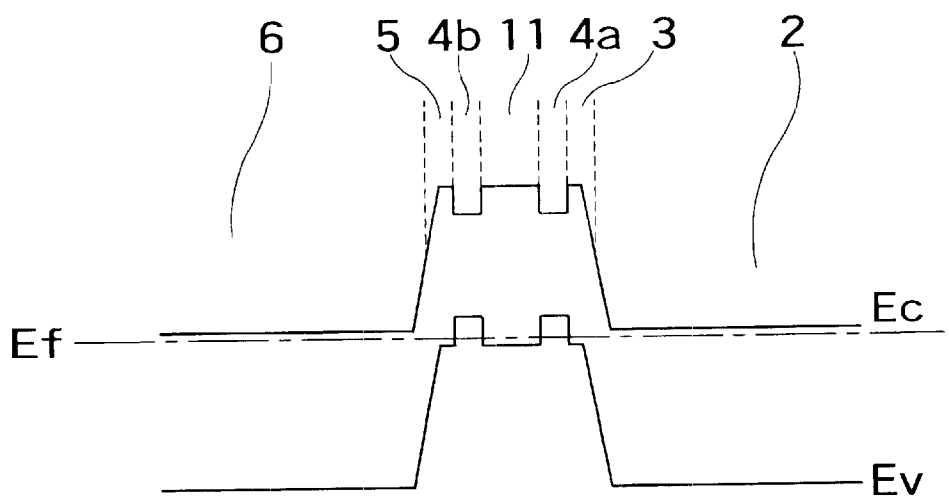
FIG. 4A shows the thermal equilibrium state of the light-emitting element shown in FIG. 3.
Figure 4B:
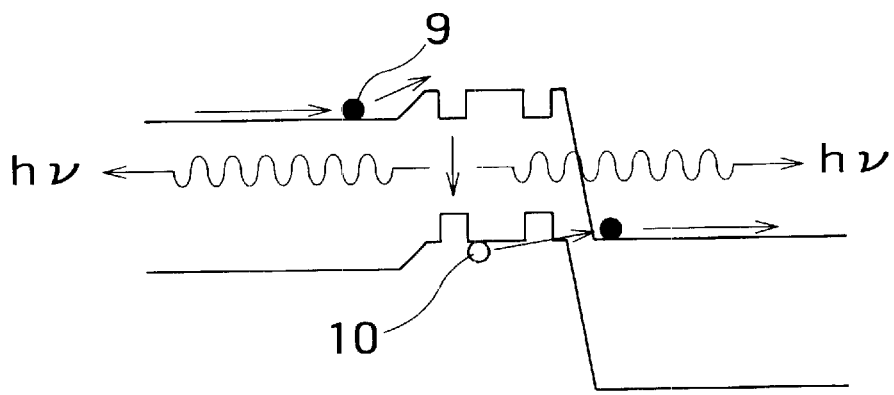
FIG. 4B shows the band view when biases are applied by polarities similar to that of FIG. 2B.
Figure 4C:
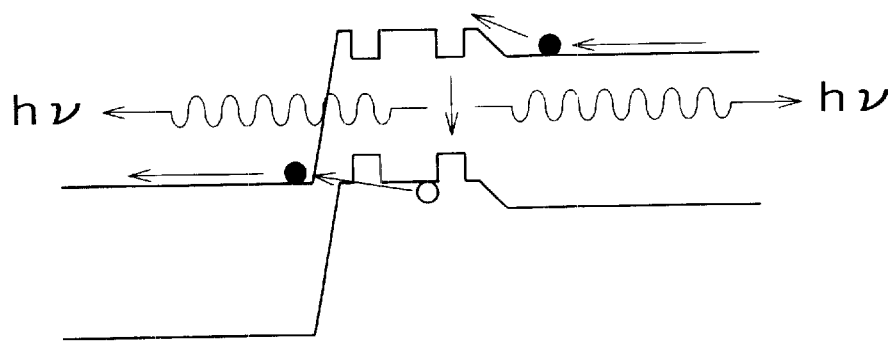
FIG. 4C shows the band view when biases are applied by polarities similar to that of FIG. 2C.

The embodiment of FIG. 3 solves the foregoing problem, and two light emitting layers 4a and 4b are provided for respective energized polarities. FIG. 4A shows the thermal equilibrium state of the light-emitting element shown in FIG. 3; and FIGS. 4B and 4C respectively band views when biases are applied by polarities similar to those of FIG. 2B and 2C. As shown in FIGS. 4A to 4C, in the structure of FIG. 3, a distance from the forward-biased p-n junction to the light emitting layer emitting lights can be shortened, and a distance from the light emitting layer emitting lights to the reverse-biased p-n tunnel junction can be lengthened.

In other words, according to the embodiment, the distance from the forward-biased p-n junction to the light emitting layer can be shortened by forming thin the high concentration p-type semiconductor layers 3 and 5, and the distance from the light emitting layers 4a and 4b to the reverse-biased p-n tunneling junction can be lengthened by forming the p-type middle layer sufficiently thick. For the p-type middle layer 11, holes are majority carriers, and the thick layer cause no particular losses of holes. Accordingly, in the embodiment of FIG. 3, it is possible to obtain light emitting efficiency completely equal to that of the conventional one-direction semiconductor light-emitting element, and efficiency can even be increased by an amount equivalent to the light emission of partial electrons overflowing in the operating light emitting layer at the light emitting layer of the tunneling p-n junction side.

In FIGS. 3 and 4, the light emitting layers 4a and 4b are provided in the p-side rather than in the p-n junction. However, these layers may be provided in the n-side, or in the p-n junction.

For example, in place of the lamination order of the reference numerals 2, 3, 4a, 11, 4b, 5 and 6 shown in FIG. 3, by using high concentration n-type InP 3' and 5' or high concentration p-type InP 11', the lamination order can be set like 2, 4a, 3', 11', 5', 4b and 6.

Figure 5A:
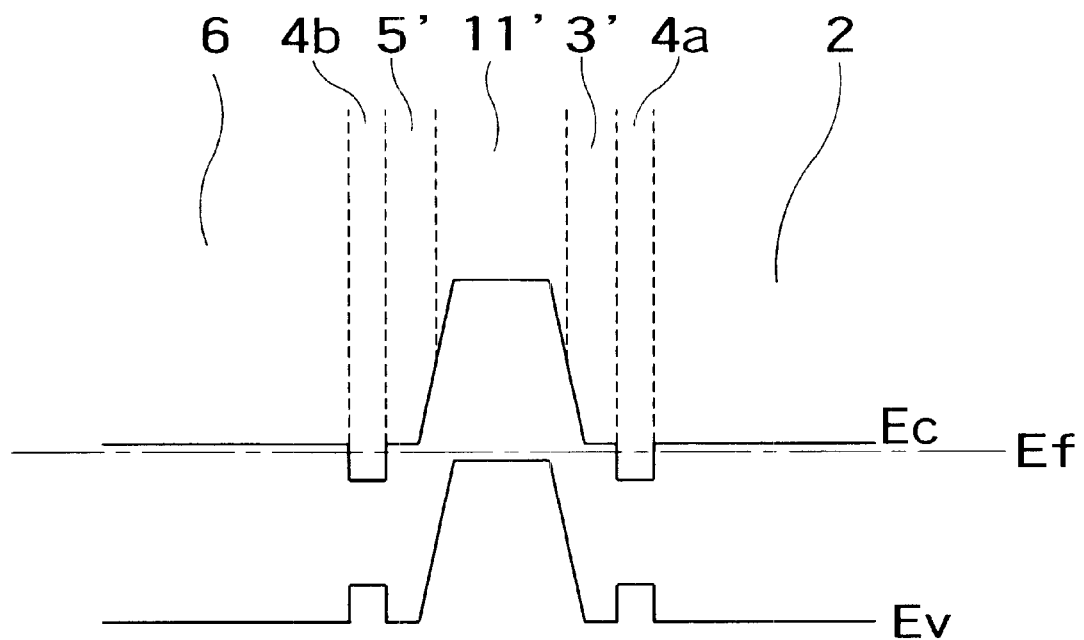
FIG. 5A shows an example of an energy band diagram when the light-emitting element having a light emitting layer provided in the n side is in a thermal equilibrium state.

FIG. 5A shows an example of an energy band diagram when the light-emitting element having a light emitting layer provided in the n side is in a thermal equilibrium state. Specifically, the device has a structure made by laminating the n-type InP 2, the light emitting layer 4a, the n-type InP 3', the p-type InP 11', the n-type InP 5', the light emitting layer 4b and the n-type InP 6 in this order. Thus, even if the light emitting layers 4a and 4b are provided in the n-side, it is possible to realize a light-emitting element, which is operated stably with respect to a bidirectional bias as described above.

Figure 5D:
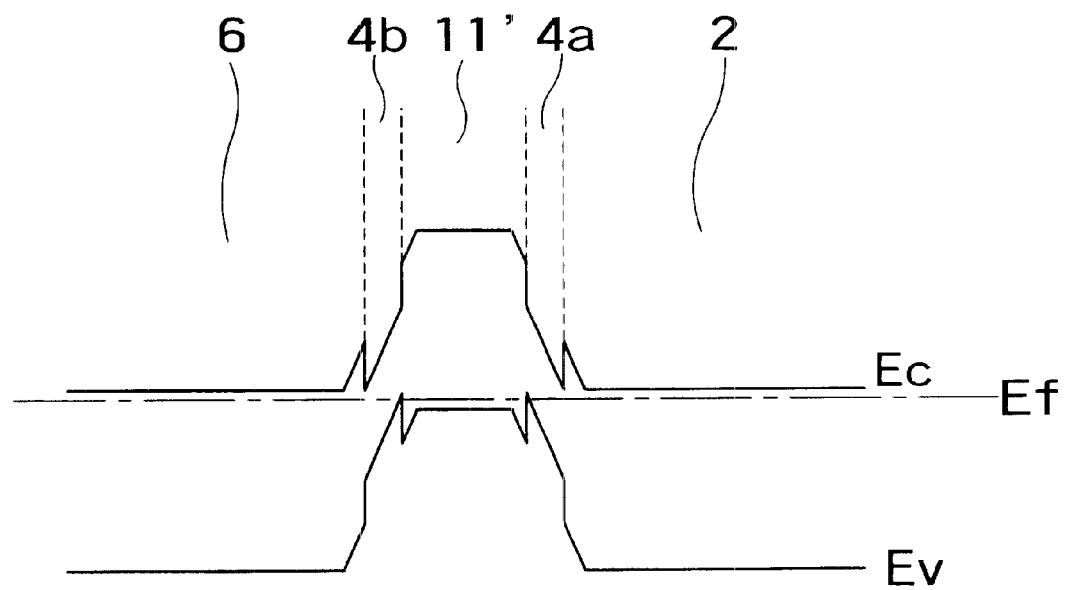
FIG. 5D shows a qualitative energy band diagram when each of the light-emitting elements shown in FIGS. 5B and 5C is in a thermal equilibrium state.
Figure 5B:
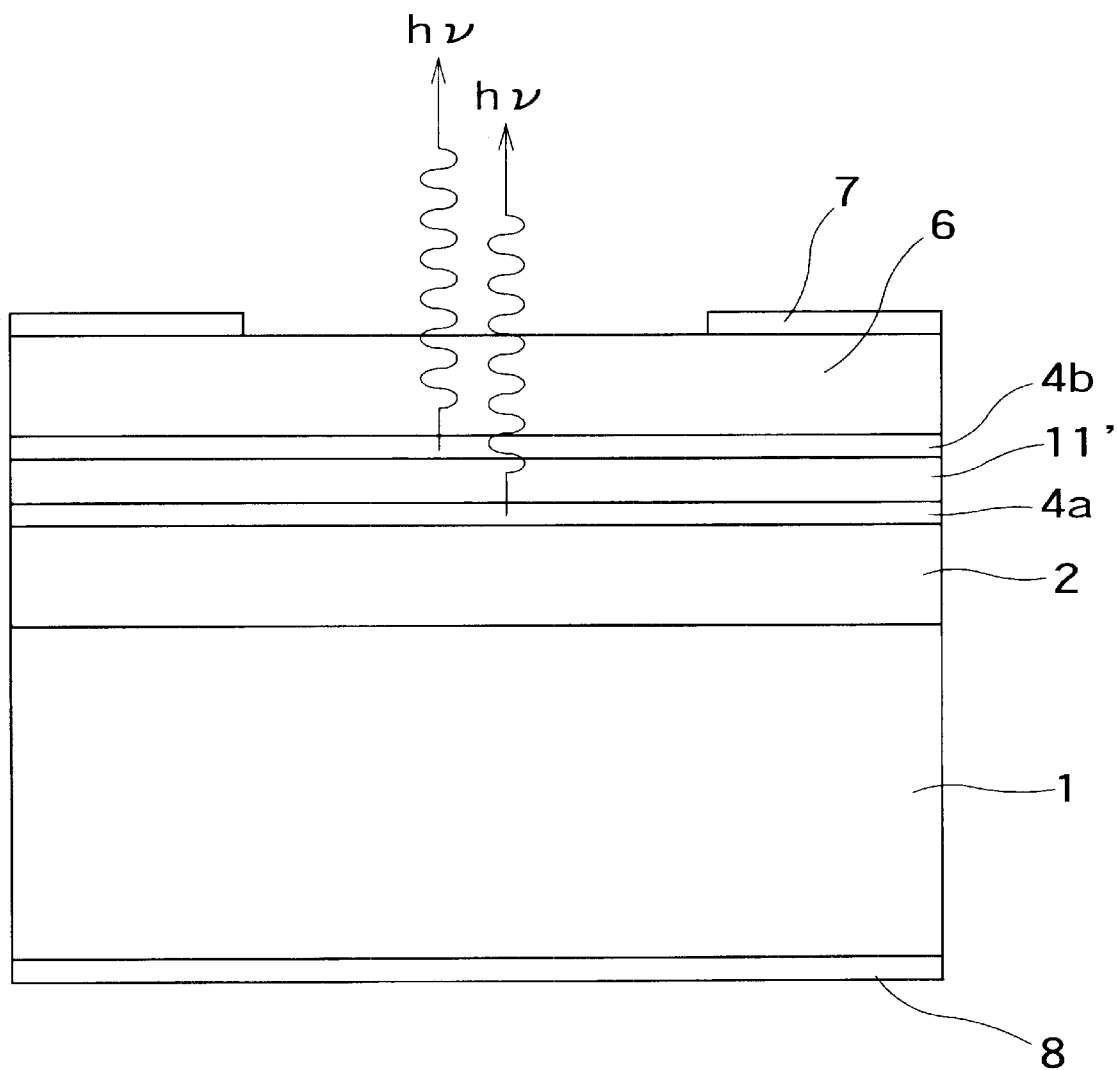
FIG. 5B shows another light-emitting element of the invention.
Figure 5C:
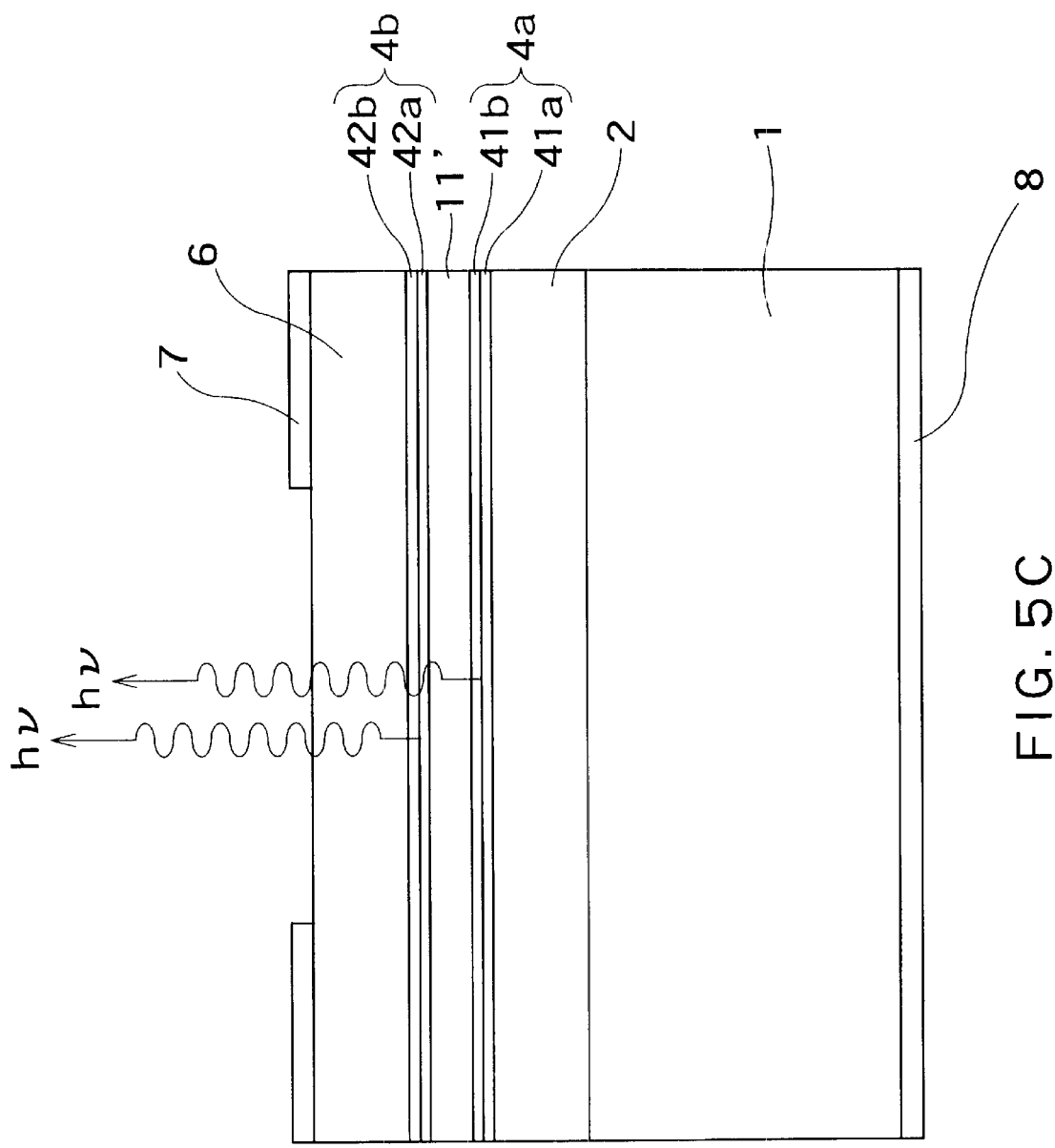
FIG. 5C shows yet another light-emitting element of the invention.

FIGS. 5B and 5C are conceptual views, each illustrating the laminated structure of the light-emitting element having a light emitting layer provided in the p-n junction.

The light-emitting element shown in FIG. 5B has a structure made by laminating the n-type InP 2, the light emitting layer 4a, the p-type InP 11', the light emitting layer 4b and the n-type InP 6 in this order. In this case, the light emitting layers 4a and 4b are made of undoped semiconductors.

On the other hand, the light emitting layer shown in FIG. 5C has a structure made by laminating the n-type InP 2, the light emitting layer 4a, the p-type InP 11', the light emitting layer 4b and the n-type InP 6 in this order, where the light emitting layers 4a and 4b respectively have p-type regions 41b and 42a, and n-type regions 41a and 42b. In other words, p-n junctions are formed in the light emitting layers.

FIG. 5D shows a qualitative energy band diagram when each of the light-emitting elements shown in FIGS. 5B and 5C is in a thermal equilibrium state.

As clearly can be seen on the figure, by forming the tunneling junctions in the light emitting layers 4a and 4b the tunneling current can be generated much easier. For example, in order to generate a considerable amount of tunneling current by using a junction made of InP, the carrier concentration may preferably higher than $2 \times 10E19/cm^3$ for n-type InP and $5 \times 10E18/cm^3$ for p-type InP. In contrast to this, in the case where the tunneling junction is made by using InGaAsP with a optical bandgap of about 1.3 $\mu$m in corresponding wavelength, a considerable amount of a tunneling current may be generated when the carrier concentration is higher than $5 \times 10E18/cm^3$ for n-type InGaAsP and $2 \times 10E18/cm^3$ for p-type InGasP.

Thus, by forming a tunneling junction in a light emitting layer having a narrower band gap, the carrier concentrations of p- and n-type layers can be advantageously set lower. Accordingly, it is possible to facilitate manufacturing the element and to reduce the internal absorption loss of an emitted light.

On the other hand, the device of FIG. 3 can be set as a multiple wavelength light-emitting element by changing the emitted light wavelengths of the light emitting layers 4a and 4b each other (e.g., 1.3 $\mu$m. and 1.2 $\mu$m). In this case, the emitted light wavelength can be changed based on an biasing direction, and novel applications such as a wavelength division multiplexing optical transmission being performed by one light-emitting element can be provided.

Figure 6:
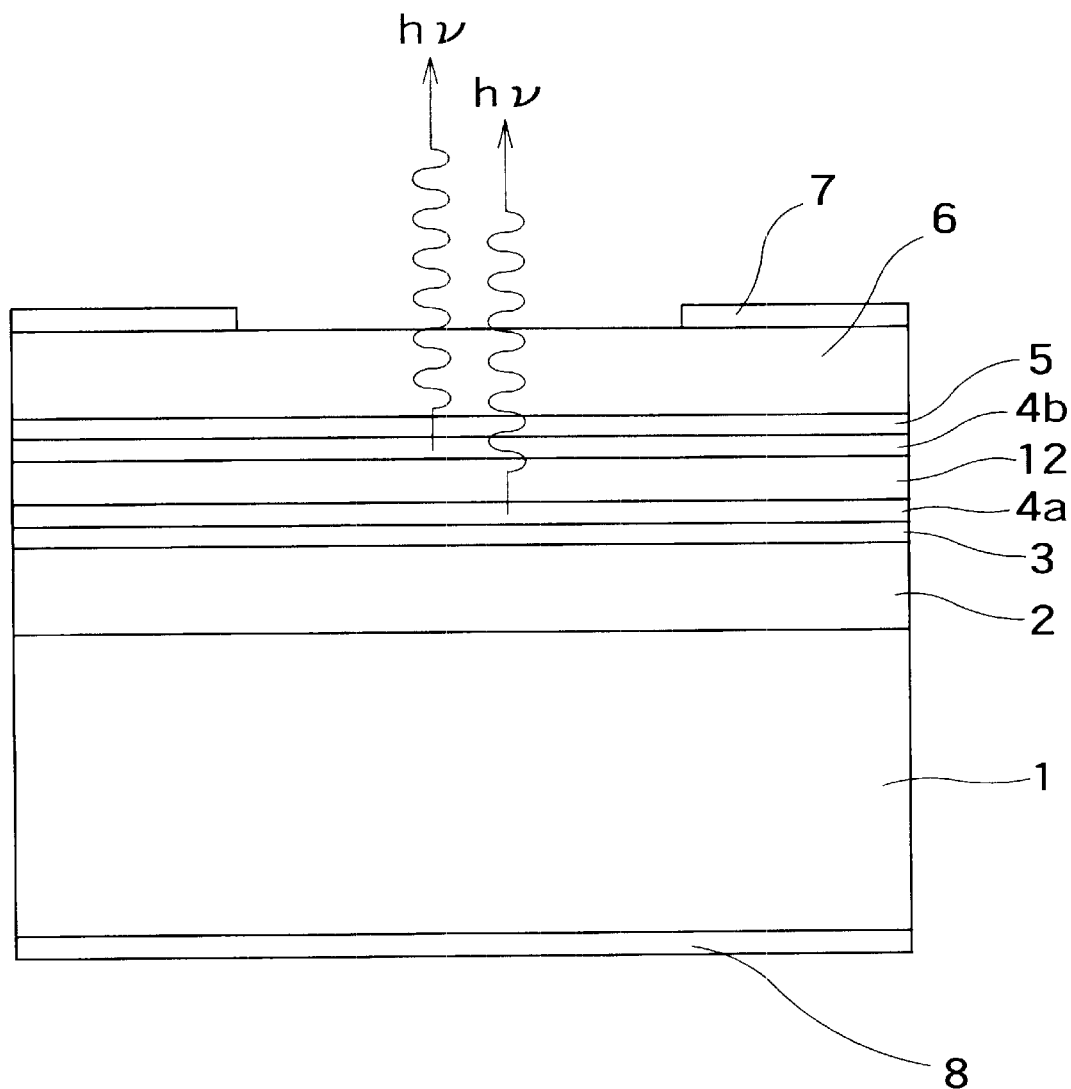
FIG. 6 shows yet another embodiment of the invention, specifically showing the example of separating light emitting layers emitting lights depending on polarities substantially completely.
Figure 7A:
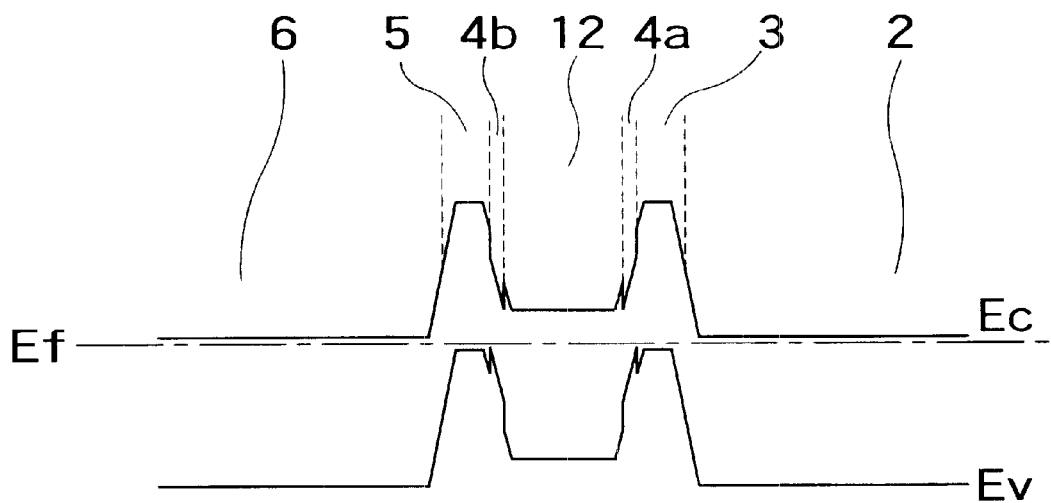
FIG. 7A shows a band structure of the element shown in FIG. 5 when this device is in a thermal equilibrium state.

FIG. 6 shows yet another embodiment of the invention, specifically showing the example of separating light emitting layers emitting lights depending on polarities substantially completely. In this structure, the undesirable mixing of the emitted lights can be suppressed even if the emitted light wavelengths of the light emitting layers (active layer) are set separately. In FIG. 6, a reference numeral 12 denotes an n-type semiconductor layer, and an n-p-n-p-n-type semiconductor light-emitting element where the p-type semiconductor layer 11 of the embodiment of FIG. 3 is replaced by n-type layer 12 is shown. A band structure when this device is in a thermal equilibrium state is shown in FIG. 7A. In the described embodiment, two p-n reverse-biased junctions and two p-n forward-biased junctions are provided.

Figure 7B:
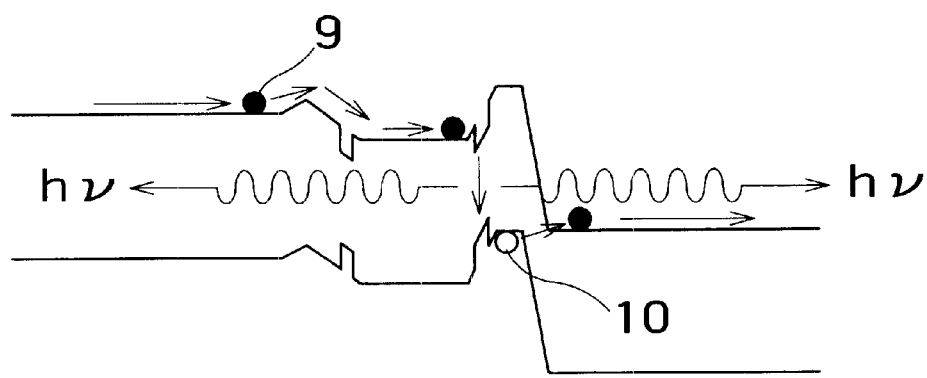
FIGS. 7B and 7C show the operation of the element shown in FIG. 6.
Figure 7C:
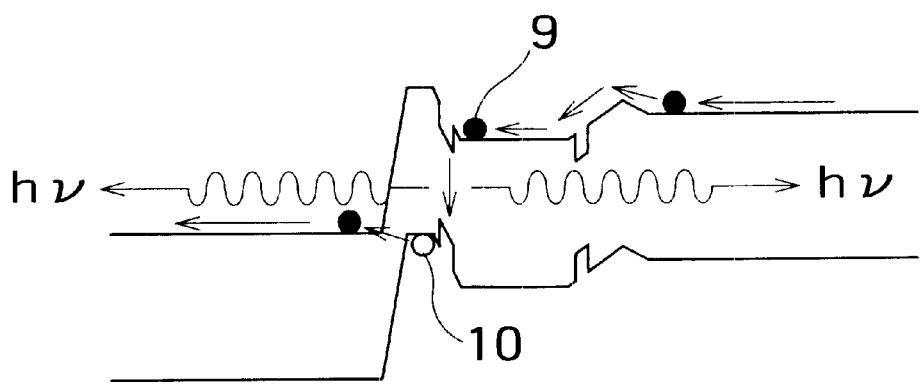

The operation of the device will be described by referring to FIGS. 7B and 7C. FIG. 7B shows a case where the electrode 7 (on the side of n-type semiconductor 6) is negative, and the electrode 8 (on the side of n-type semiconductor 2) is positive. In the case where the applied bias voltage is low, biases are mainly applied to the p-n reverse-biased junction of 2 and 3 and the p-n reverse-biased junction of 12 and 5. At the p-n reverse-biased junction of 2 and 3, as in the case of the embodiments shown in FIGS. 1 and 3, a voltage is soon reached to generate a tunneling current between the bands, reducing the increase of the applied voltage. Thus, the application of a higher bias voltage to the device thereafter is mainly directed to the p-n reverse-biased junction of 12 and 5.

As a result, a depletion layer extends in the high concentration p-type semiconductor 5. If the thickness of 5 is set such that the product of a carrier concentration and a thickness is lower than that of the n-type semiconductor layer 12, the p-type semiconductor layer 5 is completely depleted to be in a so-called punched-through state at the time when a voltage is applied to a certain extent. Accordingly, the p-n reverse-biased junction by the high concentration p-type semiconductor layer 5 becomes equal to an virtual n-n junction. A bias voltage thereafter is applied to the p-n forward-biased junction of 2 and 3, and electrons and holes by an inter-band tunneling current are injected to the light emitting layer 4a, enabling a light emitting operation to be performed.

Such a mechanism similarly applies even when the polarity of a voltage applied to the device is reverse. In this case, the light emitting layer 4b is operated to emit lights as shown in FIG. 7C.

In the embodiment of FIG. 3, while one light emitting layer is operating, minority carriers reach the other light emitting layer by diffusion, causing the undesirable light emitting operation. In contrast to this, in the embodiment of FIGS. 6 through 7C, when one light emitting layer operates (4a in FIG. 7B), the energy of majority carriers sent from the punched-through p-n reverse-biased junction is higher by a bias needed for punching-through, accordingly, minority carriers can be injected into the operating light emitting layer (4a in FIG. 7B) in the relatively lower bias state of the p-n forward-biased junction of the operating light emitting side. As a result, carriers (holes in FIG. 7B) other than high energy carriers (electrons in FIG. 7B) are easily confined within the diffusion potential of the p-n forward-biased junction (junction of 3 and 12 in FIG. 7B), resulting in the reaching of almost no carriers by diffusion to the non-operational light emitting layer (4b in FIG. 7B). Thus, the separation of the operational light emitting layer (4a in FIG. 7B) by a polarity becomes more sufficient and the undesirable light emission from the non-operational light emitting layer (4b in FIG. 7B) can be prevented. It is quite advantageous for the multi-wavelength emission purpose such as a wavelength division multiplexing optical transmission, since it becomes possible to suppress the mixing (crosstalk) between wavelengths.

Figure 8A:
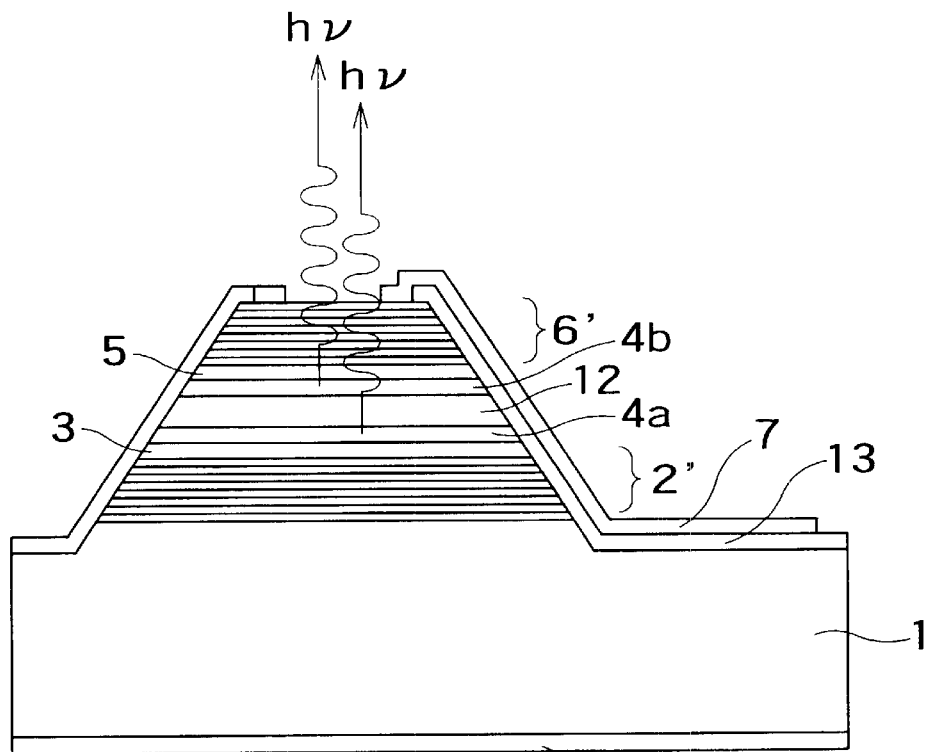
FIG. 8A shows the semiconductor light-emitting element of the described embodiment of the invention, where the embodiment of FIG. 6 is applied to a surface-emission type semiconductor laser.

Next, description will be made of the embodiment of the invention where a semiconductor light-emitting element is a semiconductor laser. FIG. 8A shows the semiconductor light-emitting element of the described embodiment of the invention, where the embodiment of FIG. 6 is applied to a surface-emission type semiconductor laser.

In the figure, reference numerals 2' and 6' denote high concentration n-type semiconductor multilayers, where a high refractive index layer and a low refractive index layer are alternately laminated for each wavelength of ¼ to realize the resonant mirror of the semiconductor laser. A reference numeral 13 denotes an insulating layer made of $SiO_2$ or the like. For the high and low refractive index layers, various materials, e.g., GaInAsP and InP of emitted light wavelength 1.1 $\mu$m or one obtained by directly adhering AlGaAs of Al composition 0.9 and a laminated film of GaAs, can be used. Light emission layers (active layer) 4a and 4b selected may have equal or different wavelengths. If the light emitting layers selected have different wavelengths, the wavelengths are set within the resonant wavelength of the laminated mirror of 2' and 6'. Herein, as an example, the resonant mirror is provided by laminating 50 pairs of GaInAsP and InP of emitted light wavelength 1.1 $\mu$m, and the wavelengths of the light emitting layers 4a and 4b are respectively set at 1.3 $\mu$m and 1.28 $\mu$m. As a result, if the electrode 8 is positive and the electrode 7 is negative in FIG. 8A, a multiple wavelength semiconductor laser having an oscillation wavelength of 1.3 $\mu$m is provided. If the electrode 7 is positive and the electrode 8 is negative, a multiple wavelength semiconductor laser having an oscillation wavelength of 1.28 $\mu$m is provided.

In the embodiment, since the resonant mirror is commonly used for the two light emitting layers, a large spacing of wavelength cannot be set for wavelength division multiplexing. However, if the n-type semiconductor layer 12 is formed in a laminated mirror structure, and if a dual mirror structure is made, where an upper laminated film is used for the light emitting layer 4b and a lower laminated film is used for the light emitting layer 4a, the two oscillation wavelengths can be separated far from each other. In this case, by setting the 4b sideshort, e.g., 1.2 $\mu$m, and the 4a side at 1.3 $\mu$m to reduce light absorption by the light emitting layer 4a at the light emitting layer 4b, the light absorption loss of the lower light emitting layer can be reduced.

Figure 8B:
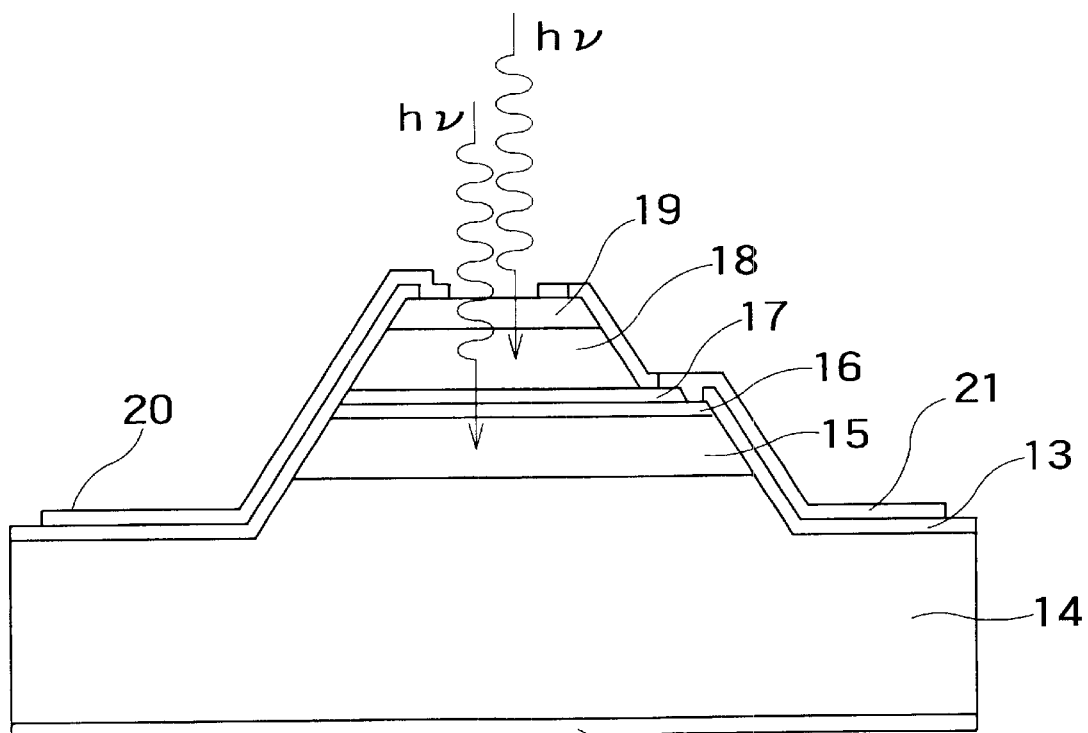
FIG. 8B shows a photodetector provided in accordance with the bidirectional semiconductor light-emitting element of the embodiment of FIG. 8A, specifically showing the example of the device equipped with two separate absorption layers to enable wavelength division multiplexing reception.

FIG. 8B shows a photodetector provided in accordance with the bidirectional semiconductor light-emitting element of the embodiment of FIG. 8A, specifically showing the example of the device equipped with two separate absorption layers to enable wavelength division multiplexing reception. In the drawing, a reference numeral 14 denotes an n-type InP substrate; 15 GaInAsP (undoped, a thickness of 2 $\mu$m) of 1.3 $\mu$m composition: 16 p-type InP (thickness of 0.5 $\mu$m); 17 n-type InP (thickness of 0.5 $\mu$m); 18 GaInAsP (undoped, a thickness of 2 $\mu$m) of 2 $\mu$m composition; 19 p-type InP (thickness of 0.5 $\mu$m); and 20, 21 and 22 electrode metals respectively. The electrode 21 is connected to both semiconductor layers 16 and 17. In this photodetector, a light having a wavelength equal to or shorter than 1.2 $\mu$m is absorbed by the layer 18, while a light having a wavelength equal to or shorter than 1.3 $\mu$m and longer than the absorption wavelength of the layer 18 is absorbed by the layer 15. Wavelength selectivity can be further enhanced by providing multilayer film filters in the upper and lower sides of the semiconductor layers 15 and 18. An example of an optical transmission system using the devices of FIGS. 8A and 8B will be described hereafter.

Figure 9:
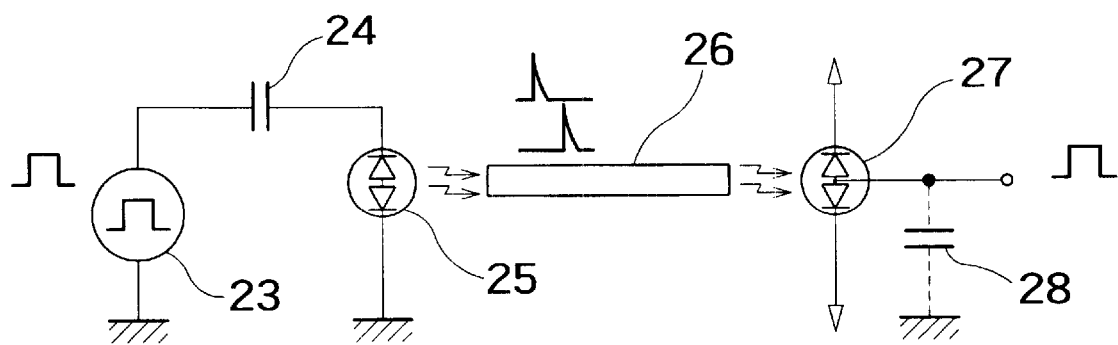
FIG. 9 is a constitutional view showing an optical transmission system of a preferred embodiment of the invention.

FIG. 9 is a constitutional view showing an optical transmission system of a preferred embodiment of the invention. In the figure, a reference numeral 23 denotes a pulse generation source; 24 a coupling capacitor; 25 the bidirectional semiconductor light-emitting element of a wavelength division multiplexing type, e.g., the device (emitting light wavelengths of 1.2 $\mu$m and 1.3 $\mu$m) shown in FIG. 8A; 26 an optical transmission path such as an optical fiber or an optical waveguide; 27 the photodetector of a wavelength division multiplexing type, e.g., the device shown in FIG. 8B; and 28 the parasitic capacity (AC equalizing circuit device) of the photodetector 27. An electric differentiating circuit is constituted by the internal resistors of the capacitor 24 and the pulse generation source 23. With this optical transmission system, by transmitting the differential wave of a pulse signal, the consumption of power can be greatly reduced compared with signal transmission over the full-width of a pulse signal. The electrical differential waves of a signal pulse (current waves flowing through the capacitor 24) alternately appear at the peak waves of positive and negative polarities, and these are converted into lights different from each other in wavelengths by the device 25, and then coupled with the optical transmission path 26. In addition, an optical signal sent through the path 26 is converted into an electric signal by the photodetector 27, and this electric signal is integrated by the capacitor 28 to restore the original pulse signal. The photodetector of FIG. 8B becomes equivalent to the connection between 31 and 32 of the conventional example of FIG. 18, constituting an equalizing circuit, and repeats the operations of charging by the light of 1.2 $\mu$m and discharging by the light of 1.3 $\mu$m.

Figure 18:
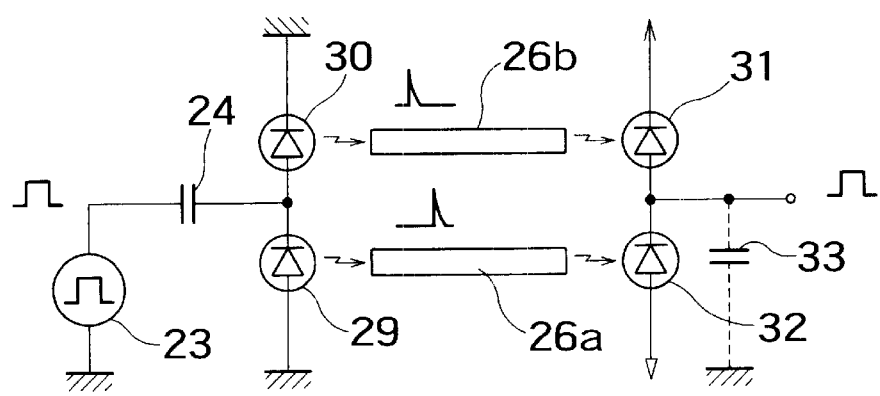
FIG. 18 shows an example of an optical transmission system using two separate semiconductor light-emitting elements.

The advantage of the described example is quite obvious if compared with the conventional example of FIG. 18. The light-emitting element, the photodetector and the optical transmission path, one each, can function similarly to the conventional system, and since one optical path is provided, an optical axis adjustment is necessary only for one transmission path. Therefore, compared with the conventional example, costs can be greatly reduced, and a mounting density can be increased.

Other preferred examples of the embodiment of the present invention will be described hereinbelow.

Figure 10:
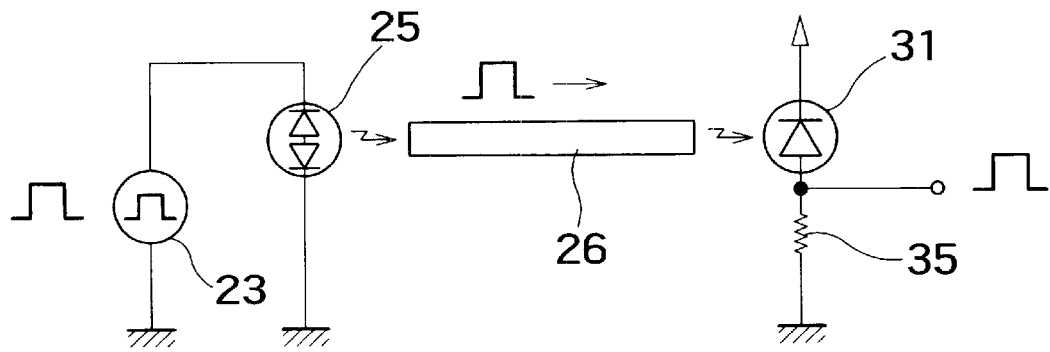
FIG. 10 shows a constitutional view of another example of optical transmission system of a preferred embodiment of the invention.

FIG. 10 shows a constitutional view of another example of optical transmission system of a preferred embodiment of the invention. In this example, a conventional photodetector 31 is employed instead of the photodetector 27 shown in FIG. 9. An electric signal having a rectangular wave form is applied to the light emitting element 25 and is converted into the optical signal having the corresponding waveform. The optical signal is transmitted through the path 26 and detected by the photodiode 31. In this example, the signal transmission speed can be much faster than the conventional system since the response speed of the light emitting element 25 can be advantageously improved compared to the conventional ones.

Figure 11:
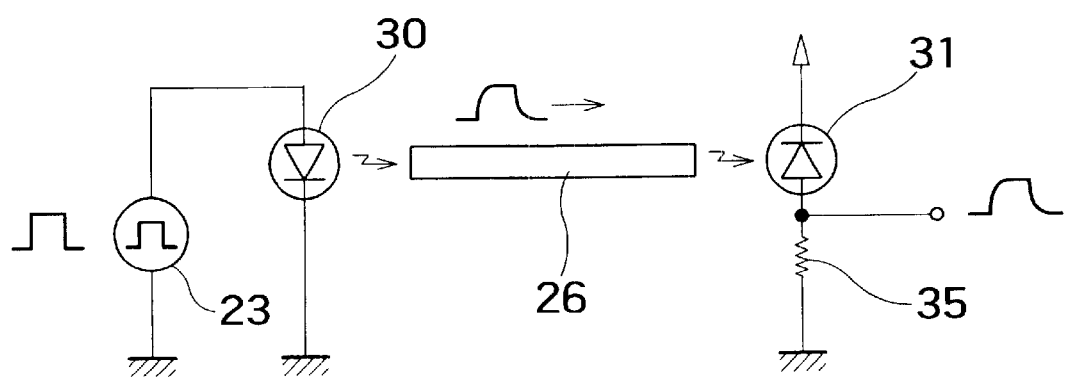
FIG. 11 shows a comparative example where the conventional light emitting element is employed.

FIG. 11 shows a comparative example where the conventional light emitting element is employed. In the comparative example, the resultant optical signal emitted from the device 30 includes a decay of the waveform due to the considerable amount of rise time and fall time which is mainly caused by the diffusion and drift motion of carriers in the device 30. In contrast to this, the device 25 of the present invention has much smaller rise/fall times since the carriers are injected and/or pulled out by the tunneling mechanism through the double tunneling junctions. This effect is especially remarkable when the outer layer of the tunneling junction is made of a conduction type with a higher mobility (this is n-type in many case). Thus, the device resistance can be decreased and the CR (capacity-resistance)-limit can be improved. As a result, the system shown in FIG. 10 can transmit the optical signal with a great fidelity to the original electric waveform, thus, the transmission speed can be greatly improved.

Figure 12:
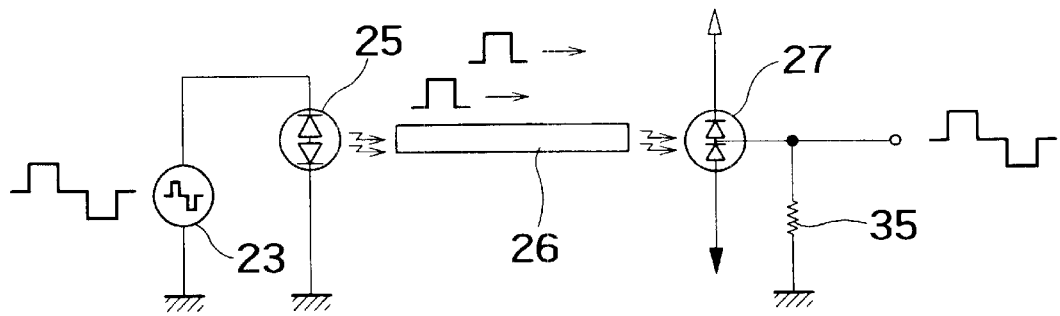
FIG. 12 shows a constitutional view of yet another example of optical transmission system of a preferred embodiment of the invention.

FIG. 12 shows a constitutional view of yet another example of optical transmission system of a preferred embodiment of the invention. In this example, a pulse generation source 23 generates tri-state electric signals having the -1-, 0- and +1-levels. The bidirectional light emitting element 25 has two separate light emitting layers having different emitting wavelengths each other as explained with regard to FIG. 8A for example. The device 25 converts the -1-level and the +1-level electric signals by selectively using either of its two light emitting layers as explained hereinabove. Thus, two kinds of optical signals having different wavelengths are transmitted corresponding to the -1-level and the +1-level electric signals. These optical signals are detected by the photodetector 27 which has two separate light-absorbing layers having different absorption wavelengths each other as exemplarily shown in FIG. 8B. Each of these light-absorbing layer can be set so as to conform to the wavelength of either of the optical signals emitted from the device 25. Thus, a 3-level optical signal transmission system can be realized with a considerably simple and inexpensive structure as shown in FIG. 12.

Figure 13:
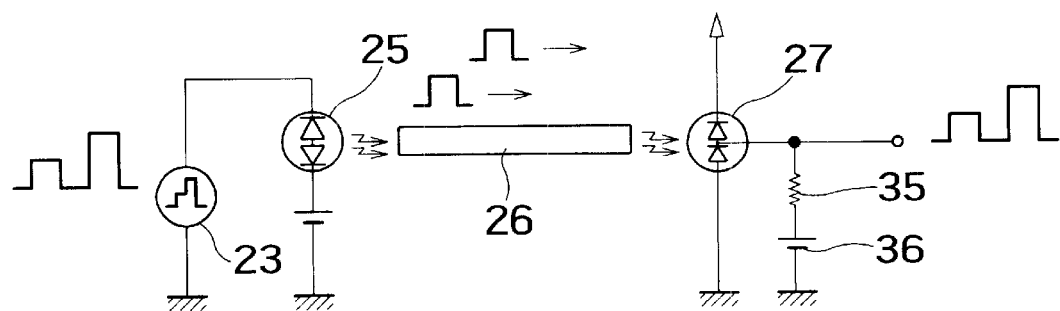
FIG. 13 shows a constitutional view of yet another example of optical transmission system of a preferred embodiment of the invention.

FIG. 13 shows a constitutional view of yet another example of optical transmission system of a preferred embodiment of the invention. In this example, a pulse generation source 23 generates tri-state electric signals having the 0-, +1- and +2-levels. The light emitting element 25 has two separate light emitting layers having different emitting wavelength. The device 25 is biased by a DC voltage at +1-level so that the 0-level electric signals are supplied as negative signals and the +2-level signal are supplied as positive signals. Thus, the device 25 emits the optical signals of first wavelength corresponding to the 0-level electric signals and second wavelength corresponding to the +2-level electric signals. No optical signals are emitted in response to the +1-level electric signals. The photodetector 27 has two separate light-absorbing layers having different absorption wavelengths each other as exemplarily shown in FIG. 8B and is biased by a DC voltage corresponding to the +1-level. Thus, the optical signals of the first wavelength is converted into the 0-level electric signals and the optical signals of the second wavelength is converted into the +2-level electric signals. The non-optical signal corresponds to the +1-level electric signal by the DC bias.

According to the example shown in FIG. 13, the transmission system can accept the tri-state electric signals having 0-, +1 and +2-levels, without including any negative signals. This is quite advantageous to improve the throughput of the driving transistors (not shown) which are usually provided in the transmitter and/or receiver to switch and/or amplify the electric signals. If the input electric signal has both positive and negative polarity, the operation speed of these transistors decreases since the transistor action have to be across the saturation region of the transistor. However, in the case of the system of FIG. 13, the electric signals does not include any negative part. Thus, the driving transistors can operate only on the positive region without crossing the saturation region and this makes the operation speed considerably high.

Figure 14:
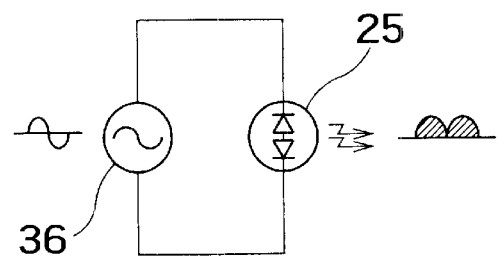
FIG. 14 shows a constitutional view of an example of light emitting device of a preferred embodiment of the invention.

FIG. 14 shows a constitutional view of an example of light emitting device of a preferred embodiment of the invention. In this example, a bidirectional light-emitting element 25 is connected to the AC power supply 36.

Figure 15:
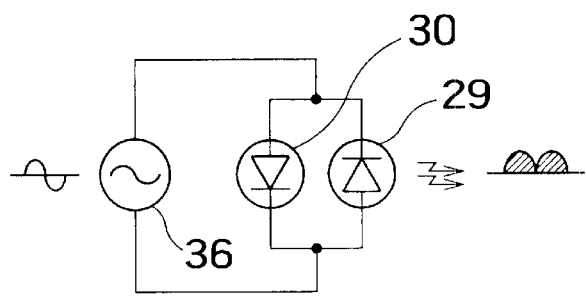
FIG. 15 shows a comparative example where the conventional light emitting elements are employed.

FIG. 15 shows a comparative example where the conventional light emitting elements are employed. As shown in FIG. 15, in the comparative example, the elements 30 and 29 are provided in parallel with reversed polarity in order to obtain the emission for both positive and negative voltage from the AC power supply 36.

In contrast to this, the light emitting device of FIG. 14 can produce the full emission by only using a single bidirectional element 25. As a result, the brightness density may be twice as high as that of the comparative example if the same number of the elements are employed. In other ward, the present invention requires only half space for mounting the light emitting elements compared to the comparative example. This invention is quite convenient for a novel light source as a replacement of the conventional lightening system using an electric bulb of a fluorescent tube. For example, if the element 25 is made of gallium nitride compound semiconductors (such as gallium nitride, indium gallium nitride, aluminum gallium nitride, indium aluminum gallium nitride, etc.) and appropriate fluorescent materials are coated thereon, a substantially white radiation can be available. By using such element 25, the light emitting device of FIG. 14 can be an advantageously compact, highly efficient and highly reliable lightening source as a replacement of the conventional lightening system.

Figure 16:
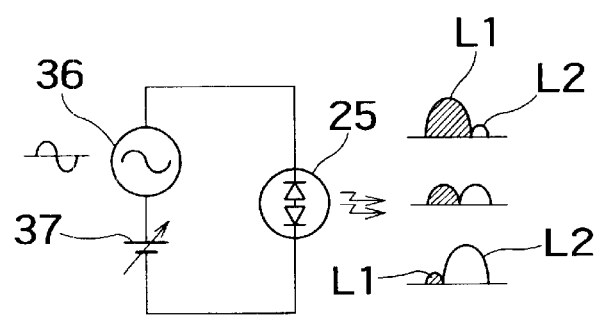
FIG. 16 shows a constitutional view of another example of light emitting device of a preferred embodiment of the invention.

FIG. 16 shows a constitutional view of another example of light emitting device of a preferred embodiment of the invention. In this example, a bidirectional light-emitting element 25 is connected to the AC power supply 36 and a DC bias 37 in series. The element 25 has two separate light emitting layers having different emission wavelength. As explained above, the element 25 can emit a light of a wavelength L1 in response to the positive voltage from the AC power supply 36 and a light of a wavelength L2 in response to the negative voltage from the AC power supply 36.

Figure 17:
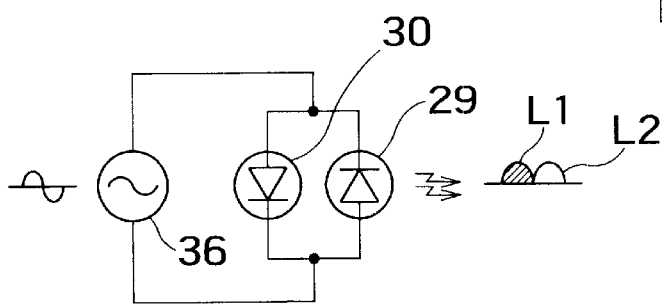
FIG. 17 shows a comparative example where the conventional light emitting elements are employed.

FIG. 17 shows a comparative example where the conventional light emitting elements are employed. In the comparative example, the lights emitted from the elements 30 and 29 have different wavelengths. For example, the element 30 emits a light of a wavelength L1 in response to the positive voltage from the AC power supply 36 and the element 29 emits a light of a wavelength L2 in response to the negative voltage from the AC power supply 36. Thus, the resultant output light is a mixture of the lights L1 and L2. However, the comparative example requires two separate elements, which cause substantially the same problem as explained with regard to FIG. 15.

According to the invention, a wavelength multiplexing can be quite easily realized by using a single bidirectional element 25. Besides, by changing the DC bias 37 the balance of the wavelengths L1 and L2 can be easily balanced at the desired level.

When the frequency of the AC power supply 36 is high enough so that the blinking of the element 25 could not be recognized to human eyes, a novel light emitting device having a variable color is realized by using a single bidirectional light emitting element 25. For example, if the wavelength L1 is set at around 650 nanometers of red band and the wavelength L2 is set at around 550 nanometers of green band, a variable color from red through green can be generated by changing the DC bias 37. By changing the DC bias 37, the mixing balance of the light components of wavelength L1 and wavelength L2 can be adjusted. As a result, visibly intermediate color such as orange or yellow can be generated.

The preferred embodiments have been described by way of specific example mainly using the GaInAsP/InP-based material. However, the present invention can similarly be applied to various other semiconductor materials, for example, an AlGaAs/GaAs-based material, an AlGaInP/GaAs-based material, a ZnSSe/GaAs-based material, an AlGaN/GaN-based material, a GaInN/GaN-based material and so on.

The foregoing specific example is mainly based on the n-p-n junction and the n-p-n-p-n junction. Needless to state, however, the present invention can be implemented by p-n-p and p-n-pn-p junctions.

Furthermore, in addition to the light-emitting diode illustrated as the light-emitting element, the present invention can be applied to the semiconductor laser.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

The entire disclosure of Japanese Patent Application No.H11-209062 filed on Jul. 23, 1999 including specification, claims, drawings and summary is incorporated herein by reference in its entirety.

What is claimed is:

1. A bidirectional semiconductor light emitting element comprising:
    a first semiconductor region of a first type of conductivity;
    a second semiconductor region of a second type of conductivity provided on said first semiconductor region;
    a third semiconductor region of a first conductivity type provided on said second semiconductor region; and
    a semiconductor light emitting layer interposed in said second semiconductor region,
    said light emitting layer emitting light by an injection of a tunneling current generated at a reverse-biased p-n junction between said first and second regions under an application of a voltage of a first polarity across said first and third semiconductor regions, and
    said light emitting layer emitting light by an injection of a tunneling current generated at another reverse-biased p-n junction between said second and third regions under an application of a voltage of a second polarity, which is opposite to said first polarity, across said first and third semiconductor regions.

2. The bidirectional semiconductor light-emitting element according to claim 1, wherein
    a tunneling current is not substantially generated at a forward-biased p-n junction between said second and third regions under the application of the voltage of said first polarity across said first and third semiconductor regions, and
    a tunneling current is not substantially generated at a forward-biased p-n junction between said first and second regions under the application of the voltage of said second polarity across said first and third semiconductor regions.

3. The bidirectional semiconductor light-emitting element according to claim 1, wherein in said p-n junction for generating said tunneling current, an energy difference between an n-side conductive band and a p-side valance band in a thermal equilibrium state is 100 meV or higher.

4. The bidirectional semiconductor light-emitting element according to claim 1, wherein a carrier concentration of said first semiconductor region and a carrier concentration of said third semiconductor region are substantially in the same level.

5. A bidirectional semiconductor light-emitting element comprising:
    a first electrode;
    a first p-n junction;
    a first semiconductor light emitting layer;
    a second semiconductor light emitting layer;
    a second p-n junction; and
    a second electrode,
    said first light emitting layer emitting light by an injection of a tunneling current generated at said first p-n junction which is reverse-biased under an application of a voltage of a first polarity across said first and second electrodes, and
    said second ligth emitting layer emitting light by an injection of a tunneling current generated at said second p-n junction which is reverse-biased under an application of a voltage of a second polarity, which is opposite to said first polarity, across said first and second electrodes.

6. The bidirectional semiconductor light-emitting element according to claim 5, wherein
    a tunneling current is not substantially generated at said second p-n junction under the application of the voltage of said first polarity across said first and second electrodes, and
    a tunneling current is not substantially generated at said first p-n junction under the application of the voltage of said second polarity across said first and second electrodes.

7. The bidirectional semiconductor light-emitting element according to claim 5, wherein in said first and second p-n junctions for generating said tunneling currents, an energy difference between an n-side conductive band and a p-side valance band in a thermal equilibrium state is 100 meV or higher.

8. The bidirectional semiconductor light-emitting element according to claim 5, wherein carrier concentration profiles of said first p-n junction and said second p-n junction are substantially in the same level.

9. The bidirectional semiconductor light-emitting element according to claim 5, wherein wavelengths of said lights emitted from said first and second light emitting layers are different from each other.

10. The bidirectional semiconductor light-emitting element according to claim 5, wherein
    said first p-n junction is provided between said first electrode and said first semiconductor light emitting layer, and
    said second p-n junction is provided between said second semiconductor light emitting layer and said second electrode.

11. The bidirectional semiconductor light-emitting element according to claim 5, wherein
    both of said first and second p-n junctions are provided between said first and second semiconductor light emitting layers.

12. The bidirectional semiconductor light-emitting element according to claim 5, wherein
    said first p-n junction is provided in said first semiconductor light emitting layer, and
    said second p-n junction is provided in said second semiconductor light emitting layer.

13. The bidirectional semiconductor light-emitting element according to claim 5, further comprising:
    a third p-n junction having the same polarity as said first p-n junction; and
    a fourth p-n junction having the same polarity as said second p-n junction,
    said third p-n junction being reverse-biased and punched-through under the application of the voltage of said first polarity across said first and second electrodes, and
    said fourth p-n junction being reverse-biased and punched-through under the application of the voltage of said second polarity across said first and second electrodes.

14. The bidirectional semiconductor light-emitting element according to claim 13, wherein majority carriers are injected into said first semiconductor light emitting layer from said punched-through third p-n junction under the application of the voltage of said first polarity across said first and second electrodes, and majority carriers are injected into said second semiconductor light emitting layer from said punched-through fourth p-n junction under the application of the voltage of said second polarity across said first and second electrodes.

15. The bidirectional semiconductor light-emitting element according to claim 13, wherein said first p-n junction is provided between said first electrode and said first semiconductor light emitting layer, said second p-n junction is provided between said second semiconductor light emitting layer and said second electrode, said third p-n junction is provided between said first and second semiconductor light emitting layers, and said fourth p-n junction is provided between said first semiconductor light emitting layer and said third p-n junction.

16. An optical system comprising:

a source for electric current; and a bidirectional semiconductor light emitting element converting said electric current into a light and emitting said light, said light emitting element having:
   a first semiconductor region of a first type of conductivity;
   a second semiconductor region of a second type of conductivity provided on said first semiconductor region;
   a third semiconductor region of a first conductivity type provided on said second semiconductor region; and
   a semiconductor light emitting layer interposed in said second semiconductor region, said light emitting layer emitting light by an injection of a tunneling current generated at a reverse-biased p-n junction between said first and second regions under an application of a voltage of a first polarity across said first and third semiconductor regions, and said light emitting layer emitting light by an injection of a tunneling current generated at another reverse-biased p-n junction between said second and third regions under an application of a voltage of a second polarity, which is opposite to said first polarity, across said first and third semiconductor regions.

17. The optical system according to claim 16, wherein said electric current includes a first current component of a positive polarity and a second current component of a negative polarity, and said bidirectional semiconductor light emitting element converts said first current component into a first light component and converts said second current component into a second light component.

18. The optical system according to claim 16, wherein said source for electric current supplies an electric current having a rectangular waveform, and said bidirectional semiconductor light emitting element emits a light having a waveform corresponding to said rectangular waveform of said electric current.

19. An optical system comprising:

a source for electric current; and a bidirectional semiconductor light emitting element converting said electric current into a light and emitting said light, said light emitting element having:
   a first electrode;
   a first p-n junction;
   a first semiconductor light emitting layer;
   a second semiconductor light emitting layer;
   a second p-n junction; and
   a second electrode, said first light emitting layer emitting light by an injection of a tunneling current generated at said first p-n junction which is reverse-biased under an application of a voltage of a first polarity across said first and second electrodes, and said second light emitting layer emitting light by an injection of a tunneling current generated at said second p-n junction which is reverse-biased under an application of a voltage of a second polarity, which is opposite to said first polarity, across said first and second electrodes.

20. The optical system according to claim 19, wherein said electric current includes a first current component of a positive polarity and a second current component of a negative polarity, and said bidirectional semiconductor light emitting element converts said first current component into a first light component and converts said second current component into a second light component.

* * * * *

UNITED STATES PATENT AND TRADEMARK OFFICE
CERTIFICATE OF CORRECTION

PATENT NO. : 6,365,911 B1 Page 1 of 1
DATED : April 2, 2002
INVENTOR(S) : Furuyama It is certified that error appears in the above-identified patent and that said Letters Patent is hereby corrected as shown below:

Title page,
Item [*] Notice, delete the phrase "by 0 days" and insert -- by 4 days --

Signed and Sealed this

Twenty-eighth Day of September, 2004

JON W. DUDAS
*Director of the United States Patent and Trademark Office*